United States Patent
Hyllberg et al.

(10) Patent No.: US 9,420,638 B2
(45) Date of Patent: Aug. 16, 2016

(54) MULTI-PART ELECTRODES FOR A HEATER LAYER

(75) Inventors: Bruce E. Hyllberg, Gurnee, IL (US); Bruce F. Taylor, Worthington, OH (US)

(73) Assignee: Nordson Corporation, Westlake, OH (US)

( * ) Notice: Subject to any disclaimer, the term of this patent is extended or adjusted under 35 U.S.C. 154(b) by 536 days.

(21) Appl. No.: 13/566,068

(22) Filed: Aug. 3, 2012

(65) Prior Publication Data
US 2013/0206746 A1    Aug. 15, 2013

Related U.S. Application Data

(60) Provisional application No. 61/521,087, filed on Aug. 8, 2011, provisional application No. 61/515,522, filed on Aug. 5, 2011.

(51) Int. Cl.
| | |
|---|---|
| H05B 1/00 | (2006.01) |
| H05K 13/00 | (2006.01) |
| H05B 3/08 | (2006.01) |

(52) U.S. Cl.
CPC .. *H05B 1/00* (2013.01); *H05B 3/08* (2013.01); *H05K 13/00* (2013.01); *Y10T 29/49083* (2015.01)

(58) Field of Classification Search
None
See application file for complete search history.

(56) References Cited

U.S. PATENT DOCUMENTS

| | | | |
|---|---|---|---|
| 4,548,341 A | 10/1985 | Hambleton | |
| 4,621,251 A * | 11/1986 | Keefe | 338/302 |
| 5,147,663 A | 9/1992 | Trakas | |
| 5,408,070 A | 4/1995 | Hyllberg | |
| 5,420,395 A | 5/1995 | Hyllberg et al. | |
| 5,616,263 A | 4/1997 | Hyllberg | |
| 5,821,499 A | 10/1998 | Crimmins et al. | |
| 5,869,808 A | 2/1999 | Hyllberg | |
| 5,984,848 A | 11/1999 | Hyllberg et al. | |
| 5,990,458 A | 11/1999 | Hyllberg et al. | |
| 6,069,346 A | 5/2000 | Hyllberg | |
| 6,285,006 B1 | 9/2001 | Hyllberg | |
| 7,638,737 B2 * | 12/2009 | Sakurai et al. | 219/444.1 |
| 8,247,747 B2 * | 8/2012 | Taylor et al. | 219/543 |
| 2003/0066638 A1 | 4/2003 | Qu et al. | |
| 2004/0074891 A1 | 4/2004 | Pendergraft | |
| 2005/0284859 A1 | 12/2005 | Konishi | |
| 2008/0087359 A1 | 4/2008 | Zurecki et al. | |
| 2008/0136066 A1 | 6/2008 | Taylor et al. | |
| 2010/0108662 A1 | 5/2010 | Taylor et al. | |
| 2012/0111851 A1 * | 5/2012 | Hyllberg | 219/438 |

OTHER PUBLICATIONS

U.S. Appl. No. 61/509,174, filed Jul. 19, 2011—Inventor Bruce E. Hyllberg for Xaloy, Inc.

* cited by examiner

*Primary Examiner* — Joseph M Pelham
(74) *Attorney, Agent, or Firm* — Roth Blair Roberts Strasfeld & Lodge

(57) ABSTRACT

The present invention is directed to an electrode structure which is most applicable for plasticating barrels having wound, wire resistance heaters. Electrode structure includes at least one lower electrode plate and an upper electrode plate. A closely wound electrode band connected to the wound wire resistance heater is formed over the lower electrode plate to assure maximum electrical, and thus, thermal transfer. An upper ceramic layer is formed over the electrode band and wound wire resistance heaters. This upper ceramic layer can be ground down to accommodate the addition of an external plate on top of the upper electrode plate.

17 Claims, 7 Drawing Sheets

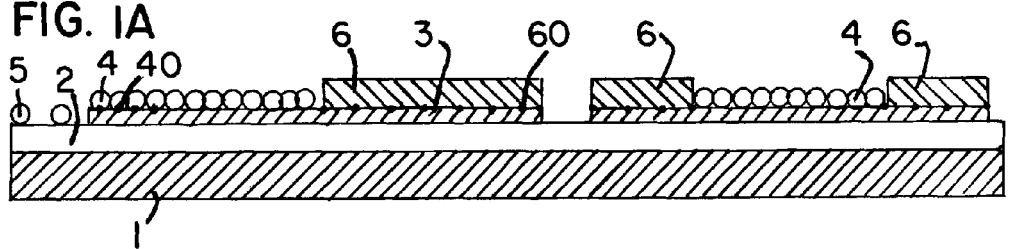
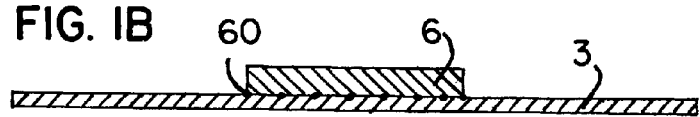
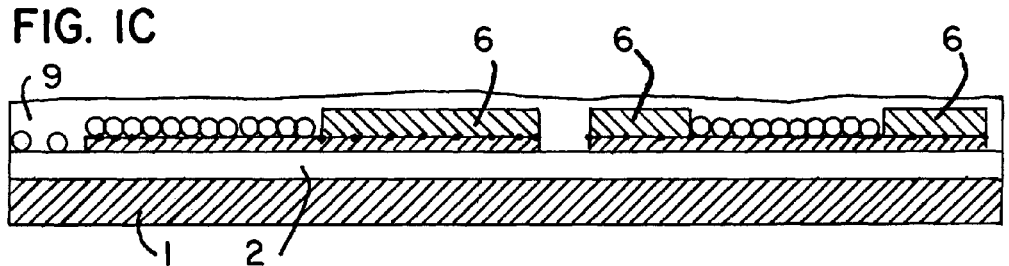
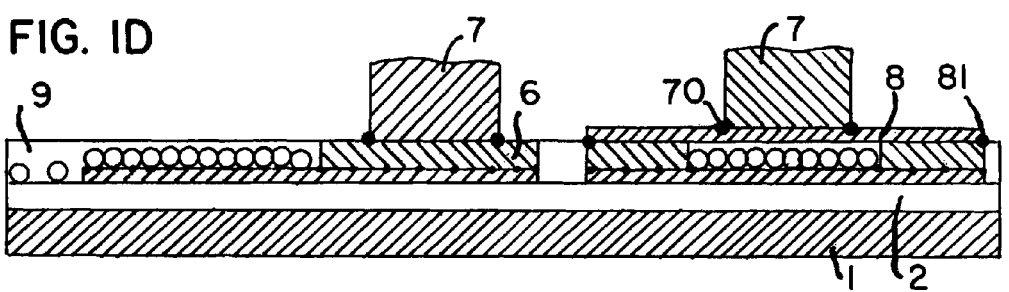

FIG. 4A
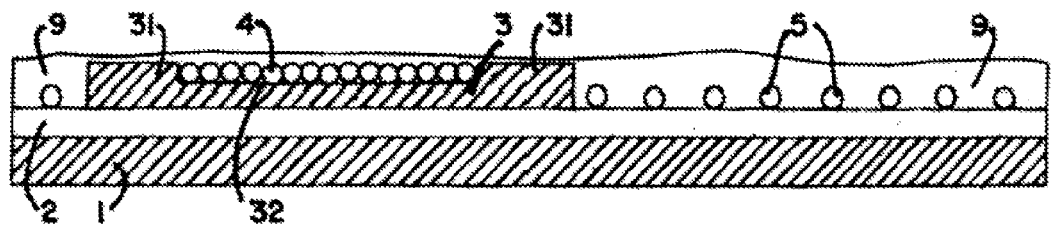
FIG. 4B
FIG. 4C
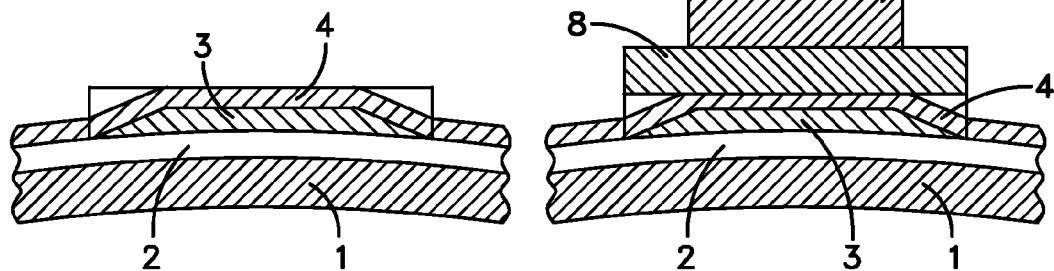
FIG. 4D
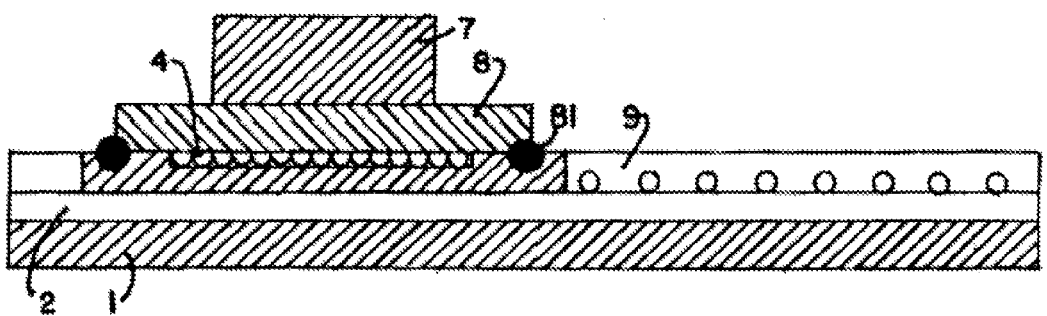

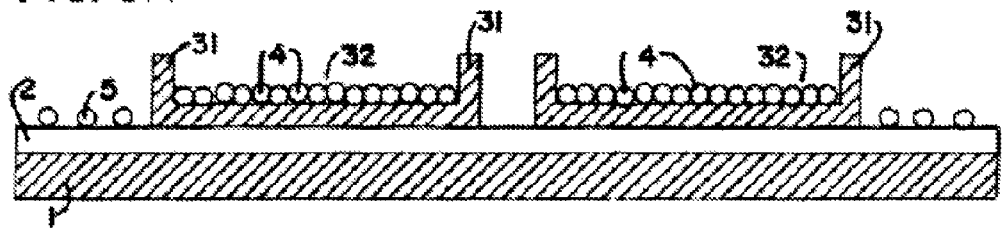
FIG. 5A
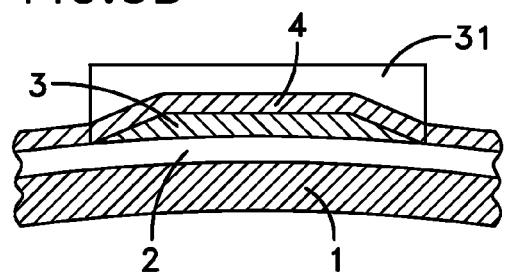
FIG. 5B
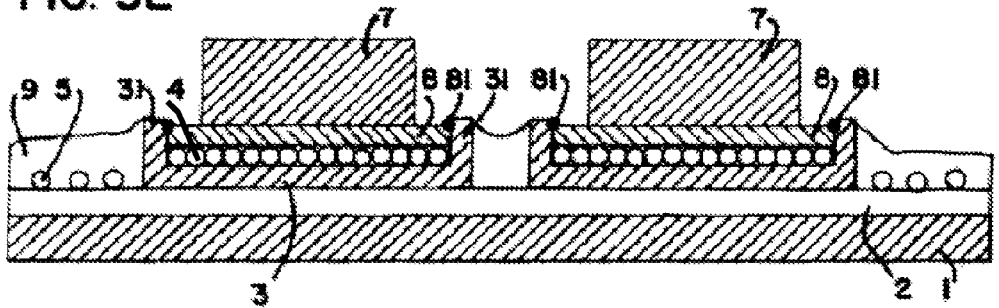
FIG. 5E
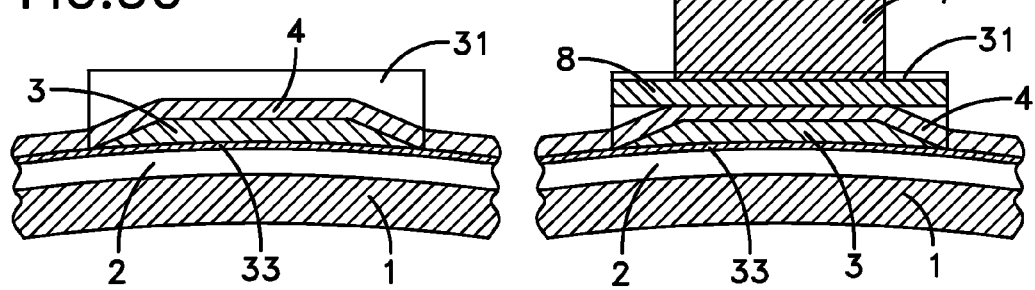
FIG. 5C
FIG. 5D

MULTI-PART ELECTRODES FOR A HEATER LAYER

PRIORITY INFORMATION

The present invention claims priority to U.S. Provisional Applications Nos. 61/521,087, filed on Aug. 8, 2011, and 61/515,522, filed on Aug. 5, 2011, and makes reference to same in their entireties.

FIELD OF INVENTION

The present invention relates generally to the heating of plasticating barrels. In particular, the present invention is directed to contact or electrode structures for connecting resistance heating elements, such as a wire-ceramic heating layer, formed on plasticating barrels, to external power sources, and other devices.

BACKGROUND OF THE INVENTION

The raw materials, such as resin pellets, processed in plasticating barrels are heated by a variety of different methods to obtain a near-liquid or plasticated state. For example, raw materials can be ground and heated before entering the barrel/screw combination for further heating to obtain plastication.

Even when this is done, the primary method of heating the raw material (such as resin pellets) includes the use of either resistance or induction heating of the plasticating barrel itself. Traditionally, the most common method of heating has been resistance heating using contact resistance heaters wrapped around the plasticating barrel.

Because of the high temperatures, severe duty cycles, and difficult environments in which plasticating barrels operate, there are many problems associated with the standard contact resistance heating of plasticating barrels. A discussion of such problems is contained in U.S. Published Patent Application No. 2008/0136066 to Taylor, et al., co-invented by one of the present inventors, having the same assignee, and published Jun. 12, 2008. This publication is incorporated herein by reference in its entirety.

Contact resistance heaters must maintain contact pressure against the barrel, around the barrel circumference and over its length to maintain efficient heat transfer. This is also true of connections between heaters and external power sources. However, the contact pressure can change with age and wear. This produces variable heat transfer resistance between the contact resistance heaters and the barrel, and ultimately non-uniform heat transfer to the barrel. Hot-spots also occur, and further accelerate aging, and eventually may lead to failure of the heating element. Also, non-uniform heating can negatively impact the plasticating process and the quality of the plastic parts, which are produced from the plasticating process.

More recently, wire-ceramic heating systems have been introduced to the plasticating industry. With wire-ceramic heaters, it is important that a secure and reliable connection be formed between wound wire heaters and the external power sources. The connections must not loosen during the plasticating operations. This is necessary to prevent problems when heating the barrel and conducting the overall operation of the plasticating system. It should be noted that the manufacture of resistance wire-ceramic heater layers formed on plasticating barrels can be problematic since it is often difficult to maintain the proper level of tension on the wires during the manufacturing process.

A discussion of this technology is found in U.S. Published Application No. U.S. 2012/0111851, published May 10, 2012, by one of the present inventors and incorporated herein by reference. This application is based upon PCT/U.S. 2010/043062, filed Jul. 23, 2010, and entitled "Method and Apparatus for Providing a Machine Barrel With a Heater." The disclosed system can serve as a starting point for a wide range of improvements in this art. However, there are certain difficulties inherent to this design so that this design can be improved upon.

The mechanical arrangement of an electrode on a cylindrical plasticating barrel makes external connections difficult under the best of circumstances, and under extreme conditions very problematical. In particular, loosening of the external connections can result in localized high resistances, resulting in localized over-heating, and eventually failure of the electrical connection. Improvements in this technology are needed to ensure a better quality electrical connection between the wound wire and the external (power supply) under all operating circumstances.

One approach to this problem is found in Provisional Patent Application No. 61/509,174, entitled "Thermally Sprayed Electrode for a Ceramic-Wire Heater Layer," filed Jul. 19, 2011, which includes one of the inventors of the present application. The improvements include the thermal spraying of a metallic band enclosing closely wound electrodes at the end of heater coils, thereby constituting a surface electrode for a connection to external devices. While this constitutes an excellent solution to the aforementioned challenges of connecting external devices to a plasticating barrel, there are still some drawbacks.

In particular, the subject thermal spraying operation is expensive and time-consuming. Further, the thermally sprayed metal band can be improved upon with respect to the mechanical strength provided to the heater windings, and the overall barrel structure. Accordingly, a simpler, more economic, and structurally stronger alternative would be highly desirable.

While the devices contained in the aforementioned published patent publications serve as admirable beginnings for solutions to the aforementioned problems, the current technology admits to yet further improvement. In particular, external connection arrangements for plasticating barrels admit to substantial improvements.

An improved connection system for plasticating barrels would address the aforementioned needs with an arrangement that is more convenient and efficient than existing connection methods. With this improved system, the potential for localized heating due to high current density at an external connection point would be minimized. Further, the improved connection would securely hold and protect the wound heater wire and electrodes under tension, as well as providing means for easier and more reliable attachment of external power connections, in a wide variety of configurations.

SUMMARY OF INVENTION

Accordingly, it is a primary object of the present invention to provide an improved contact arrangement between resistance heaters on plasticating barrels and their power supplies.

An additional object of the present invention is to provide an adequate electrical contact area for positive, robust and well-bonded electrical connections that can survive high temperatures and extreme thermal cycles such as those found in plasticating operations.

It is another object of the present invention to prevent surface oxidation of electrical contacts and resistance heater wires, especially the closely spaced wires constituting an electrode band of a wound-wire heater.

It is a further object of the present invention to provide an external contact arrangement so that electrical connections can be made at optimal points around the circumference of a plasticating barrel.

It is an additional object of the present invention to provide an external contact arrangement for a plasticating barrel wherein localized heating, resulting in the failure of electrical connections, is avoided.

It is still another object of the present invention to better facilitate manufacturing of spirally wrapped barrel heater wires by simplifying progressive manufacturing steps, while maintaining tension on the heater and electrode windings.

It is yet a further object of the present invention to provide a plasticating barrel having a relatively small vulnerable electrode area while maintaining a relatively large area of electrical contact.

It is again an additional object of the present invention to provide a plasticating barrel having electrode areas that are easy to insulate.

It is yet a further object of the present invention to provide a plasticating barrel having an electrode that is mechanically durable, despite relatively thin ceramic coatings.

It is still an additional object of the present invention to provide a plasticating barrel having electrodes that easily interface with standard electrical terminals.

It is again another object of the present invention to provide a plasticating barrel that has a relatively low profile to facilitate wrapping with conventional insulation.

It is still another object of the present invention to provide a plasticating barrel having electrode arrangements that prevent oxidation.

It is again an additional object of the present invention to provide a plasticating barrel having an electrode arrangement that facilitates the use of a wide range of alternative electrical connectors on the plasticating barrels.

It is still another object of the present invention to provide a plasticating barrel, heater and electrode arrangement that is lower in cost than conventional arrangements.

It is again a further object of the present invention to provide a plasticating barrel heater arrangement which can be produced using a reduced number of manufacturing steps.

It is still a another object of the present invention to provide a connection arrangement for a plasticating barrel in which a power wire from an external power source can be connected to the wire resistance heaters using a conventional electrical connector arrangement.

It is yet an additional object of the present invention to provide a connection arrangement for a plasticating barrel, whereby a wound wire heater can be installed under a desired amount of tension.

It is still a further object of the present invention to provide a connection arrangement for a wound wire-ceramic heater that can be provided using standard hardware arrangements.

It is again a further object of the present invention to better facilitate manufacturing of spirally-wrapped heater wires by holding them at a desired tension, and maintaining that tension after the manufacturing process is complete.

It is yet another object of the present invention to provide a wound wire electrode for a heating system that admits to a wide variety of different variations and structural adaptations.

These and other goals and objects of the present invention are achieved by a heating system for a plasticating barrel having a wound wire resistance heater over an electrically insulating ceramic layer, both covering a metallic cylinder substrate. The heating system includes at least one lower electrode plate placed on the ceramic layer. An electrode band of closely wound wires is formed over at least a portion of an upper surface of the lower electrode plate. An upper electrode plate is attached to the upper surface of the lower electrode plate in an area not occupied by the electrode band of closely wound wires. The top surface of the upper electrode plate is exposed for attachment to an external electrical connector.

Another aspect of the present invention encompasses a method of forming a wound wire heating system on a plasticating barrel. This method includes forming a first ceramic layer on a metallic barrel substrate. Then a lower electrode plate is placed on a ceramic layer and at least one wire electrode is placed over a first portion of an upper surface of the lower electrode plate. Then an upper electrode plate is attached to a portion of the lower electrode plate not occupied by the wound wire electrode.

Another embodiment of the present invention is directed to a heating system for a plasticating barrel, including a wound wire heater over an electrically insulating ceramic layer which covers a metal cylinder substrate. The heating system includes at least one electrode electrically connected to and separate from the wound wire heater. The electrode is constituted by a plurality of closely spaced windings. A tightened band is arranged over the electrode windings.

In another embodiment, a method of assembling a heating system for a plasticating barrel includes a first step of forming a lower ceramic layer over a metallic cylinder substrate. A wire electrode is closely wound on the lower ceramic layer, and a tension band is tightened over the wire electrode. The heating coil is then wound on the lower ceramic layer.

DESCRIPTION OF THE DRAWINGS

FIGS. 1(a)-1(d) depict the steps of a first process for assembling a first electrode arrangement.

FIGS. 4(a)-4(d) depict the steps of an assembly process for an alternative electrode configuration.

FIGS. 5(a)-5(e) depict the steps of an additional assembly process to create a further variation in electrode structure.

DETAILED DESCRIPTION OF THE PREFERRED EMBODIMENT

Figure 2A:
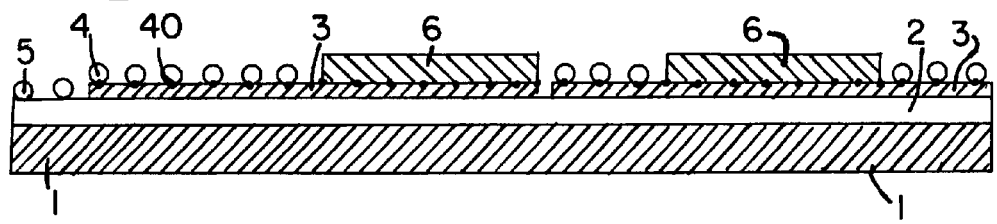
FIGS. 2(a)-2(d) depict the steps of a second process for assembling a second electrode configuration.
Figure 2B:
Figure 2C:
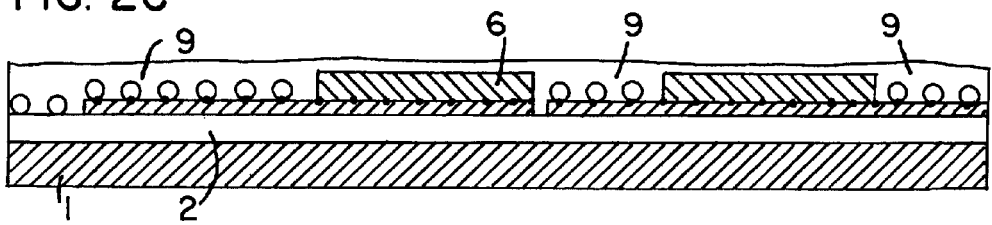
Figure 2D:
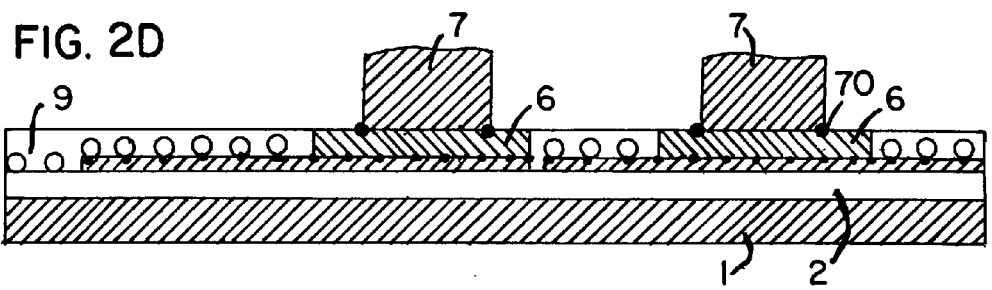

The present invention is directed to multi-part electrode structures, for connecting an external power source (not shown) to wound-wire contact resistance heater 5 arranged over a lower ceramic insulation layer 2, covering a plasticating barrel constituted by cylinder 1.

Part of the electrode structure is a band 4 composed of closely spaced wire windings (each attached at one end of heater windings 5) to form the electrode band. The closely spaced windings of electrode band 4 are formed over a lower plate 3 of a multi-part electrode structure. Upper electrode plates 6 are placed on the lower electrode plates 3 adjacent to the closely wound electrode band 4, as depicted in the drawings.

As depicted in FIG. 1(*a*), two upper electrode plates 6 on lower electrode plate 3 can flank or straddle a closely wound electrode band 4. The upper electrode plates 6, when exposed, can serve as anchor points for external connector structures 7, such as studs, nuts, or the like. External or transition electrode plates 8 can also be provided to support connector structures 7 (such as nuts, studs, terminals, or the like), as depicted in FIG. 1(*d*). A key feature of the present system is that the manufacturing/assembly process is simplified, so that manufacturing steps are limited in number and complexity. For example, expensive thermal spraying of metal layers is eliminated from most embodiments.

Figure 6:
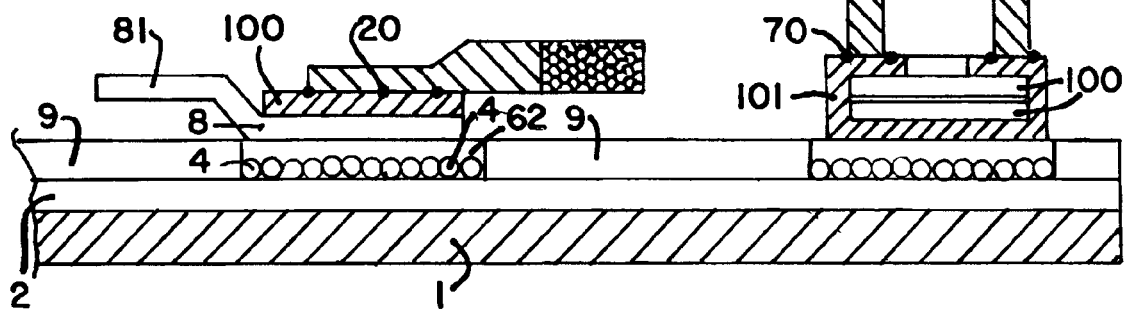
FIG. 6 is a side sectional view of a wound wire heater connection using a tension band and a band clamp.
Figure 8:
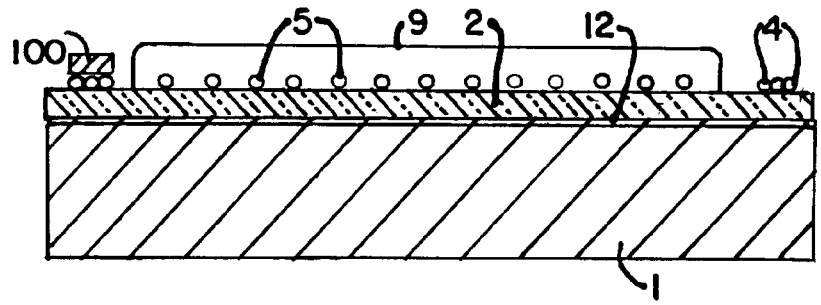
FIG. 8 is a side view of a simplified wire terminal using a tension band applied directly to the wires.

As part of the simplified manufacturing system, the upper and lower electrode plates 6, 3 can be welded together (welds 60), before placement on lower ceramic layer 2. Likewise, the connection structures 7 (such as studs, nuts, terminals or the like) can be welded to the upper electrode plate 6. Optionally, the closely wound electrode bands 4 can have their individual windings spot-welded (40) to the lower electrode plate 3, as depicted in the various drawings. This provides greater mechanical stability, and helps maintain winding tension. Further, the welds 40 will maintain tension so that if a tension band 100 had been used during the assembly of the heater winding wires 5 and the electrode bands 4, then the tension bands 100 can be removed without ill effect. However, the bands can be maintained as depicted in FIGS. 6 and 8, and explained infra.

Both the lower electrode plate 3 and upper electrode plate 6 are preferably made from an oxidation-resistant, high-temperature alloy such as stainless steel. The upper electrode plate 6 may optionally be polished or ground to enhance electrical conductivity to external connection devices, such as stud structure 7. The grinding of the upper electrode plate 6 can be performed after applying (preferably by spray) an upper ceramic layer 9, which must be ground down. The grinding operation of the overall ceramic layer 9 eliminates the need for masking. The grinding operation both exposes and polishes the upper electrode plate 6, while removing excess ceramic material from ceramic layer 9. Ceramic layer 9 is used to help protect, insulate and mechanically hold both the heater winding 5 and the closely wound electrode band 4. The ceramic layer 9 is preferably thermally conductive and electrically insulating.

The lower electrode plate 3 of the combined electrode structure provides a large, smooth electrical contact area for the closely wound electrode bands 4. This creates a very robust and efficient electrical connection that will survive high temperatures and extreme thermal cycling, which are typical with plasticating barrels.

Further, this overall arrangement facilitates the maintenance of high tension in the closely wound electrode band 4, as well as the heater winding 5. This, aided by the spot-welds 40 (or the use of tension band 100), helps to ensure the mechanical stability of the overall plasticating barrel 1 structure. By enclosing or flanking the closely wound electrode bands 4 on either side by adjacent upper electrodes 6, further mechanical stability and protection of electrode bands 4 can be achieved. The closely wound electrode bands 4 are generally in the range of 0.25 to 0.5 inches wide, and extend 360 degrees around cylinder 1, at the ends of each of the wound wire heaters 5.

The general environment, in which the present invention operates, as depicted in the drawings, begins with a metallic barrel or cylinder 1 (either with or without a binding alloy layer as depicted in FIG. 8) suitable for plasticating operations. A lower ceramic layer 2 is formed over cylinder 1, of sufficient quality to electrically insulate the cylinder 1. Resistance heater coil 5 is spirally wound over the lower ceramic layer 2, and around the cylinder 1. Despite the fact that lower ceramic layer 2 is electrically insulating, a high degree of thermal conductivity is maintained between the heater coil 5 and the metal cylinder 1.

It should be noted that the windings of the heater coil 5 are typically not uniform along the entire length of cylinder 1. Rather, separate heaters (corresponding to separate temperature regions) are preferably formed by different heater coils 5 at various points along cylinder 1. The heater coil windings 5 are covered with an upper ceramic layer, 9. Such resistance heaters must be terminated with appropriate contacts, electrodes, or interfaces to which external electrical sources (not shown) are connected to apply power to the heater coils.

The wire heater coils 5 must have electrodes or other interface means at each end of each heat zone in order to receive external electrical power. The number and parameters of the heat zones along the cylinder are mandated by the type of plasticating system and the type of material to be handled. Electrodes at the end of each heat zone are formed using closely spaced wire coil bands 4, as best depicted in FIG. 8. The closely spaced wound electrode band 4 is generally in the range of 0.25 to 0.5 inches wide, extending 360° around the cylinder 1. The wire of closely wound electrode band 4 is carefully wound under significant tension. It is important that the tension stay below the breaking point of the wires. The closely spaced wound electrode band 4 is sealed by the top ceramic layer 9 to help hold the wound structure (both heater coil 5 and band 4) tightly in place.

Before the closely wound electrode band 4 is formed, the lower electrode plate 3 is placed on the lower ceramic insulator 2. The coil of the closely wound electrode band 4 is carefully applied under tension to the upper surface of the lower electrode plate 3. Some or all of the closely spaced windings of the electrode band 4 are then preferably tack welded (40) to the top of the lower electrode plate 3. This way the tension on the winding wires can be more securely maintained, and greater security is maintained between the individual windings of electrode band 4 and the lower electrode plate 3. The upper electrode plate 6 (if not previously attached to lower electrode plate 3 is then welded (using spot or TIG welds 60) to the lower electrode plate 3.

The closely spaced windings of electrode band 4 are helpful for the overall mechanical stability of the plasticating barrel since the closely spaced windings of electrode band 4 help to hold both the wire heater coils 5 and lower electrode plate 3 tightly against the cylinder 1 (via ceramic layer 2) during assembly of the wire-ceramic heating system, as well as during the plasticating operation. The advantage of this arrangement, therefore, increases structural stability and ensures greater electrical contact area between the heater windings 5 and external power sources (not shown).

As depicted in FIG. 1(*a*) two upper electrode plates 6 are welded (using welds 60) to the lower electrode plate 3 on either side of a closely wound electrode band 4. This arrangement serves to better secure and protect the closely wound electrode band 4, as well as the rest of the resistance heater windings 5. This arrangement also serves to support the external or transition plate 8 which can be welded to the upper surface of the upper electrode plate 6. The external or transition plate 8 can then be used to support a stud or nut structure 7 for standard connections to an external power supply (not shown).

In the alternative, the stud or nut structure 7 can be pre-welded to the plate 8 before the external plate 8 is welded to the tops of upper electrode plates 6. This arrangement simplifies the overall installation and insures secure and proper connections to any external devices.

Just as the stud or nut structure 7 can be pre-welded to external or transition plate 8 before being welded to upper electrode plate 6, other pre-welding operations can take place before the combined plate structures are attached to the plasticating barrel 1. In particular, as depicted in FIG. 1(*b*), the upper electrode plates 6 can be spot-welded to the lower electrode plate 3. This operation is more easily carried out before the lower electrode plate 3 is secured over the lower ceramic insulator layer 2 on the cylinder 1. Besides the structural stability of the subject arrangement, a maximum in heat transfer efficiency is facilitated, by avoiding deterioration caused by hot spots, oxidation or the like.

After the combined electrode plates (6, 3) are in place on the lower ceramic insulator 2, the entire structure can be covered with an upper or top ceramic layer 9 as depicted in FIG. 1(*c*). This can be done without taping or masking. Afterwards, the ceramic layer 9 is ground off until the upper surfaces of the upper electrode plates 6 are exposed, as depicted in FIG. 1(*d*). Then either the stud or nut structure 7 is welded directly to the upper surfaces or upper electrode plates 6, or an external or transition plate 8, with a pre-welded stud or nut structure 7, is welded to the upper surface of upper electrode plate 6.

The overall result of manufacturing the arrangement depicted in FIGS. 1(*a*)-1(*d*), is a very robust, electrical contact configuration for a plasticating barrel, achieved by a relatively simple manufacturing process. The lower ceramic layer 2 and the upper ceramic layer 9 are both thermally sprayed during the manufacturing process. The ceramic material is such that it is thermally conductive, but electrically insulating. By welding the upper and lower electrode plates 3, 6, good mechanical and/or structural characteristics are achieved. These in turn help maintain optimal electrical connections.

The arrangement of FIGS. 2(*a*)-2(*d*) is very similar to that of FIGS. 1(*a*)-1(*d*). The process is essentially the same in both sets of drawings. However, there is only a small variation in the lower and upper electrode plate (3, 6) arrangement of FIGS. 2(*a*)-2(*d*). In particular, the wound electrode band 4 in this embodiment is not closely spaced. However, all of the electrode band 4 windings are welded to lower electrode plate 3 for structural stability. All of the other features are similar, except for the absence of an external or transition plate 8. A nut, stud or threaded bolt-like structure 7, is welded directly to the upper surface of upper electrode plate 6.

In FIGS. 3(*a*)-3(*c*), another variation in the manufacturing process is depicted. In particular the lower electrode plate 3 is welded to the upper electrode plate 6, the top surface of which is welded to the stud or nut structure 7. Then the combined welded electrode structure (3, 6, 7) is placed on lower ceramic insulator 2. An alternative is depicted on the right side of FIG. 3(*a*). A stud or nut structure 7 is welded directly to the top surface of the lower electrode plate 3. This particular approach simplifies the overall manufacture since upper electrode plate 6 is absent. However, the structural stability provided by upper electrode plate 6 is also absent.

The closely spaced electrode band 4 is then wound in place over the upper surface of the lower electrode plate 3. Afterwards, the upper ceramic layer 9 is applied. Only the stud or nut structure 7 is masked during the step of spraying the upper ceramic layer 9. In this process, the upper ceramic layer 9 need not be ground down. All that is needed for electrical connections is the removal of the masking material (not shown) from the nut or stud structure 7.

Figure 3A:
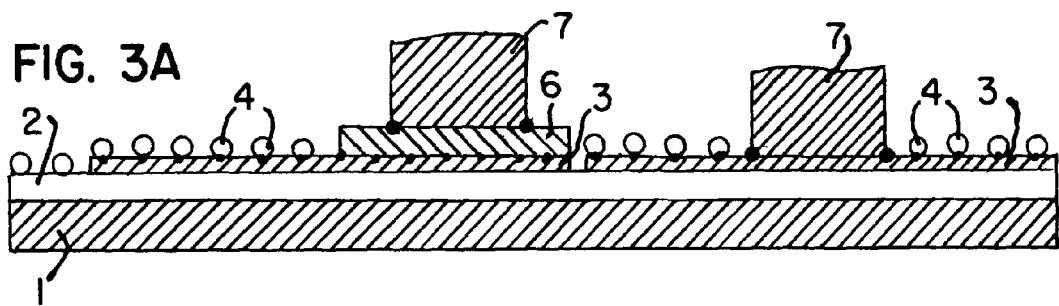
FIGS. 3(a)-3(c) depict the steps of an alternative process for assembling another variation of the electrode structure of FIGS. 1(a)-1(d).
Figure 3B:
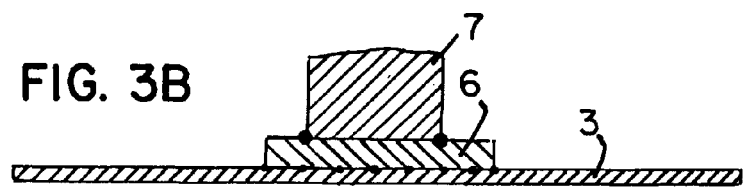
Figure 3C:
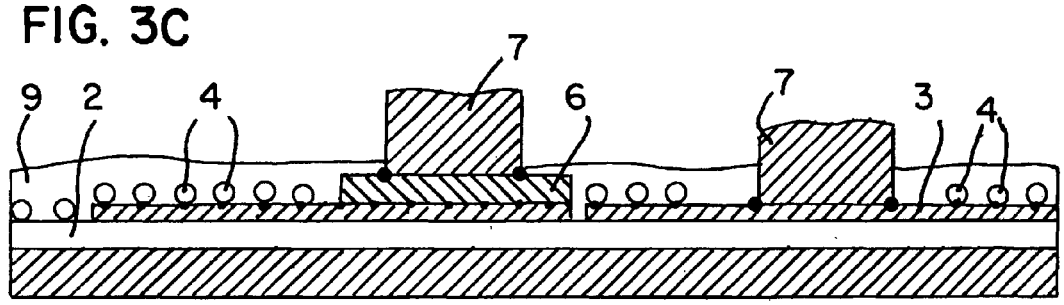

It is important to notice in the FIGS. 3*a*-3*c* embodiment, that there are certain advantages in the electrode arrangement. The width of the lower electrode plate 3 is in the range of 0.5-0.75 square inches. As previously described, with respect to FIG. 3*a*, an external stud or nut structure 7 is easily welded directly to the upper surface of lower electrode plate 3. This saves time in the manufacturing process, and provides a simple way of staggering the heights of the nut or stud connection structures 7. As a result, this arrangement provides offset electrical contacts which may be more desirable when making connections to external electrical devices. Also, because the stud or nut structure 7 is more deeply buried beneath the top ceramic layer 9, there is greater stability and protection for this particular structure from oxidation and the like.

Another advantage of the stud or nut structure 7 being placed (welded to the combined upper electrode plate 6 and lower electrode plate 3) on lower ceramic insulator 2 before the application of upper ceramic layer 9, is that the manufacturing step of grinding the upper ceramic layer 9 is not necessary. As a result, manufacturing time is shortened. Therefore, the assembly and manufacture of the overall wire-ceramic heating system for the plasticating barrel is greatly simplified.

Of course, to make assembly even easier, rather than welding all three electrode pieces (3, 6, 7) together, there is an option of forming two or more of these elements as a single structure from a single piece of stock material. If external or transition plate 8 is used, it can also be pre-welded to either or both of nut or stud structure 7, or upper electrode plate 6.

Another arrangement is depicted in FIGS. 4(*a*)-4(*d*) and 5(*a*)-5(*e*). In particular, additional structural variations in the electrode arrangements of the present invention are disclosed. The lower electrode plate 3 is modified to have a preferably rectangular concavity 32, defined by raised end pieces 31. The wound electrode band 4 is arranged in the concavity 32 of the lower electrode plate 3. This arrangement provides additional protection for the closely wound electrode band 4, especially during the grinding operation necessary to remove the excess upper ceramic layer 9. Further, the raised end pieces 31 provide additional support as well as protection for any structures to be placed on the lower electrode plate 3.

Once the upper ceramic layer 9 is ground down to the correct level, the tops of raised end pieces 31 are exposed, but not the wound electrode band 4. Then, external structures (nut or stud structure 7, and/or external or transition plate 8) can be placed on the raised ends 31. Preferably, the external or transition plate 8 is welded to the raised ends 31 to hold the nut or stud structure 7 securely to the overall plasticating barrel structure. The key advantage to this electrode arrangement is that the upper electrode plate 6 (in FIGS. 1(*a*)-1(*d*), 2(*a*)-2(*d*), and 3(*a*)-3(*c*)), as well as the welds 60 (as depicted in FIGS. 1(*a*)-1(*d*), are entirely eliminated. Another advantage is that the relatively delicate, closely wound electrode band 4 is protected by its placement in concavity 32 formed by the raised end pieces 31.

In FIGS. 5(*a*)-5(*e*), raised end pieces 31 are somewhat heightened over those of FIGS. 4(*a*)-4(*d*). The raised end pieces 31 of FIGS. 5(*a*)-5(*e*) are also somewhat thinner than those found in FIGS. 4(*a*)-4(*d*). As depicted in FIG. 5(*e*), external or transition plate 8 fits into concavity 32 between raised end pieces 31. The external or transition plate 8 is held in place by TIG welds 81. This arrangement provides for enhanced structural stability for the stud or nut structure 7, which is attached to external or transition plate 8.

In the embodiments of both FIGS. 4(a)-4(d) and FIGS. 5(a)-5(e), all that needs to be done with respect to the application of upper ceramic layer 9 is that the tops of raised end pieces 31 be masked. The result of this arrangement is that greater structural stability is achieved while reducing the number and complexity of the manufacturing steps. The step of grinding ceramic layers is substantially reduced. Also, one of the welding steps can be eliminated by forming both the external or transition plate 8 and the stud or nut structure 7 as a unitary structure from a single piece of stock, as depicted in FIGS. 4(a)-4(d) and 5(a)-5(e).

There is an additional structure in the embodiment of FIGS. 5(a)-5(e) that should be noted. Underneath the bottom of the lower electrode plate 3, there is a thin base plate extension 33, approximately 1"-3" long. This is optional and can be used to provide an additional contact for wound electrode band 4, and to adjust the overall height of the lower electrode plate 3. The optional thin base plate extension 33 is generally in the range of 2-20 mils thick, and is made of an oxidation-resistant, high-temperature alloy such as stainless steel.

As depicted in FIGS. 4(b), 4(c), 5(b), 5(c), and 5(d), the lower electrode plate 3 is formed as a ramped structure (as seen in the side view of the subject drawings). This ramped structure permits easy winding over the lower electrode plate 3 by the closely wound electrode band 4. The result is a much better mechanical arrangement for holding the lower electrode plate 3 to the lower ceramic layer 2 of barrel 1. An example of the size of lower electrode 3 is approximately sixteen millimeters by sixteen millimeters for a two foot long plasticating barrel. While larger lower electrode plates 3 can be used for same size barrel, adding a curvature to the lower surface of the lower electrode plate 3 facilitate a better hold on the plasticating barrel 1 (through ceramic layer 2). In the alternative, the thin base plate extension 33 can be curved to better conform with the curvature of the combined barrel lower ceramic layer (1, 2).

FIG. 8 depicts closely wound electrode band 4 held in place with a tension band 100 (as shown in cross section only). This embodiment includes the use of a bonding alloy 12 beneath the first ceramic layer 2. In the FIG. 8 embodiment, tension band 100 is preferably of a conductive material so that a connection can be made to an external power source (not shown). The FIG. 8 embodiment is a modification of one of the embodiments of U.S. Published Patent Application No. 2012/0111851, previously incorporated herein by reference. The improvement resides in the tension band 100, which is preferably a flexible, metallic element that can conform to the shape of the closely wound wire band electrode 4.

Most tension band systems have a band clamp, such as structure 101, as depicted in FIG. 6. The clamp allows the band 100 to be placed under a desired amount of tension, thereby serving to hold the band 100 tightly to a particular surface, and to hold anything underneath the band to that surface. Tension bands and clamping systems are well known in a variety of different technologies and vocations. Accordingly, further description of such devices is not necessary for an understanding of the present invention. Rather, it is the application of a tension band 100, and a tensioning or clamping system, such as 101, to the heating system electrodes that is novel to the inventive system.

One advantage of the clamp 101 is that a terminal structure such as a stud or nut structure 7 can easily be fitted thereto. This can be in the form of welded construction, using spot welds 70 as depicted in FIG. 6. In the alternative, the clamp or closure 101 can be formed of a single piece to include a terminal structure such as stud or nut structure 7.

The left side of FIG. 6 depicts a combination of a number of different variations possible with the tension band 100. One variation includes a tension band 100 that is metallic, and has a wire eyelet 20 welded with the band. Eyelet 20 can serve as a terminal to an external power source (not shown).

Because band 100 is normally flexible, it can be placed directly on electrode band 4 (as depicted in FIG. 8) and tightened so as to conform (at least partially) to the shape of the wire windings constituting the electrode band 4. Sufficient tightness of band 100 will insure a good electrical connection between electrode band 4 and the external power source (not shown) connected to the band 100.

A flexible or curved tab electrode 81 with base 83, extension 81, and contact opening 82 (depicted in both FIGS. 6 and 7) can be placed under band 100 and over the wire electrode band 4 to make an electrical connection to an external power source (not shown). Curved tab electrode 81 can be configured so as to conform to the wires of electrode band 4. Tab electrode 81 can also be flexible so as to conform to the shape of the wires of electrode band 4 when put under tension by band 100 and clamp 101.

In another variation, as depicted in FIG. 6, the closely wound electrode band 4 can be flanked by upper ceramic insulator layer 9. This helps to hold electrode band 4, as well as any other structures placed on the electrode band 4. The result, enhanced electrical connection is achieved.

In yet another variation depicted in FIG. 6, a sprayed metal layer 62 can be deposited between the two upper ceramic insulator layers 9 that are flanking closely wound electrode band 4. However, the use of this sprayed metal layer 62, as previously indicated, has certain drawbacks with regard to time and expense of manufacturing final product. Accordingly, this variation is not necessarily the most desirable embodiment.

Figure 7:
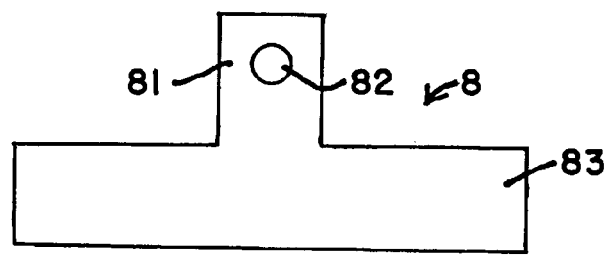
FIG. 7 is a top view of an electrode terminal or connector.

It should be understood that tension band 100 in the FIGS. 6-8 embodiments can also be applied to the structures of the embodiments depicted by FIGS. 1(a-d), 2(a-d), 3(a-c), and 4(a-d). Because of the overall adaptability of all the aforementioned embodiments and their variations, the flexible metallic tension band 100 can be applied in a variety of different configurations. For example, flexible metallic tension band 100 can be placed over upper electrode plate 6 in FIG. 1d. A terminal or nut configuration 7 can be attached to the metallic tension band 100. In this configuration, flexible tension band 100 substitutes for external or transition plate 8.

In another alterative, flexible tension band 100 can be placed over external plate 8 and a terminal or nut configuration 7 can be attached (by welding or the like) to the top of the flexible tension band 100. Likewise, the flexible tension band 100 can be substituted for external plate 8 in the FIG. 4d configuration. The flexible tension band 100 can be placed over external plate 8 in the FIG. 5e arrangement. Another terminal or nut external configuration 7 can be attached to either the flexible band 100, or the band tensioning or clamping unit 101.

If the flexible tension band 100 is placed directly on the closely wounded wire electrode 4 (as depicted in FIG. 8), sufficient pressure can be maintained so that the rest of the heater windings 5 can be laid down under tension. Another tension band 100 can be placed on the other end of heater windings 5 on another closely wound electrode band 4. Afterwards, any other means (welding of windings, ceramic layers, or the like) can be used to hold the windings of the heater 5 and the closely wound electrodes bands 4 in position.

For example, an upper ceramic layer can be formed around or upon one or both of the tension bands 100. The permanent use of the tension bands 100 with the band clamps 101 allows tension to be maintained on heater windings 5 and the closely wound electrodes bands 4 with fewer welds (such as 40) to hold the heater wires 5 and the closely wound electrode bands 4 in position.

The aforementioned embodiments and variations selected will be determined by the characteristics of the plasticating barrel. The materials to be processed, and the ultimate products being manufactured. The overall manufacturing environment will also determine the selection of the most appropriate connection arrangements.

Figure 9:
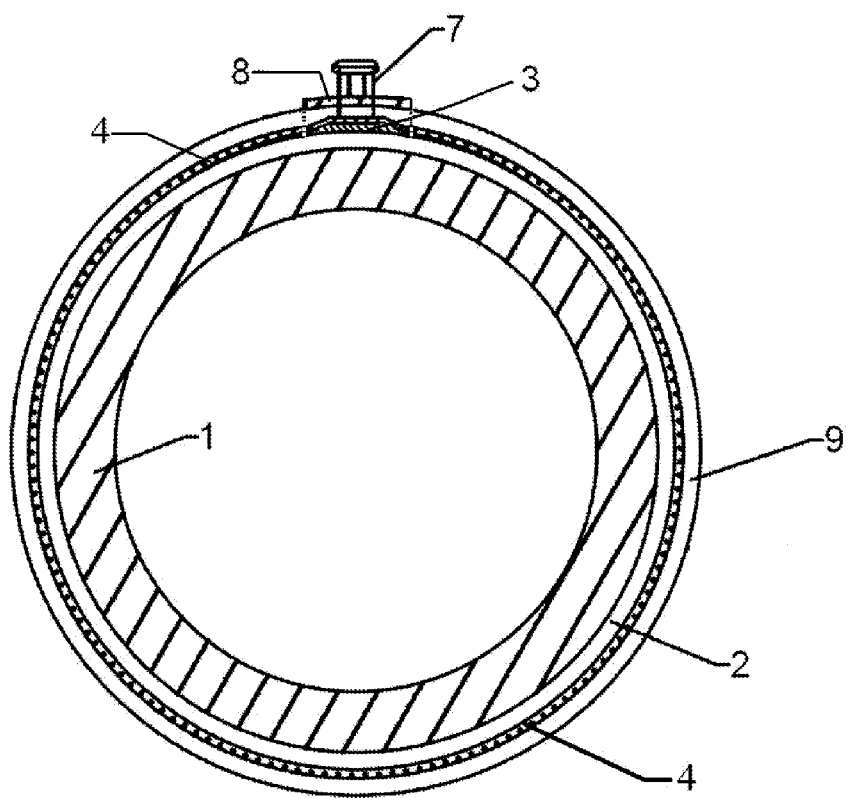
FIG. 9 is an end view of a plasticating barrel with band wire and electrode.

FIG. 9 depicts a representation of the entire circumference of a barrel containing wound wire heater, and emphasizing the terminal structure of the present invention. Closely wound wire electrode 4 is found near the position above lower electrode plate 3. The closely wound wire electrode 4 extends to the heater windings 5, which are generally uniform around the circumference of the barrel outside of the regions of the terminals.

While a number of embodiments have been presented as examples, the present invention is not limited thereto. Rather, the present invention should be understood to extend to any and all modifications, variations, permutations, adaptations, derivations, and embodiments that would occur to one skilled in this technology, once having possession of the teachings of the present invention. Therefore, the present invention should be limited only by the claims.

We claim:

1. An electrode structure for a plasticating barrel having a wound wire-resistance heater over an electrically insulating first ceramic layer, both covering a metallic cylinder substrate, said electrode structure comprising:
   a) at least one lower electrode plate placed on said first ceramic layer;
   b) at least one electrode band of wound wire formed over at least a portion of an upper surface of said lower electrode plate;
   c) a second layer formed over at least said electrode band of closely wound wire; and
   d) a pair of upper electrode plates attached to said upper surface of said lower electrode plate in an area not occupied by said electrode band of wound wire, wherein a top surface of each said upper electrode plate is exposed for attachment to an external plate with an external electrical connector having a terminal structure, said external plate bridging said pair of upper electrode plates.

2. The electrode structure of claim 1, wherein said wound-wire of said at least one electrode band includes windings wound in close proximity to each other.

3. The electrode structure of claim 2, wherein at least one winding of said electrode band is welded to said lower electrode plate.

4. The electrode structure of claim 3, wherein:
   f) said external plate is attached to said upper electrode plate beneath said terminal structure.

5. The electrode structure of claim 4, comprising a plurality of said lower electrode plates, and a plurality of said upper electrode plates.

6. The electrode structure of claim 3, further comprising at least one recess in which said electrode band of closely wound windings is arranged, said at least one recess being flanked by two of said upper electrode plates.

7. The electrode structure of claim 6, wherein said external plate is arranged over said at least one electrode band to bridge said recess.

8. The electrode structure of claim 7, wherein said lower electrode plate is configured to have a double ramp cross-section.

9. The electrode structure of claim 1, wherein said second layer is a ceramic layer.

10. The electrode structure of claim 1, wherein said second layer is a metallic layer.

11. An electrode structure for a plasticating barrel having a wound wire-resistance heater over an electrically insulating first ceramic layer, both covering a metallic cylinder substrate, said electrode structure comprising:
   a) at least one lower electrode plate having a recess in an upper surface of said at least one lower electrode plate, said lower electrode plate positioned on said first ceramic layer;
   b) at least one electrode band of wound wire formed over said recess in said upper surface of said at least one lower electrode plate, said wound wire includes a plurality of windings in contacting adjacent proximity;
   c) a second layer formed over at least said electrode band of contacting wound wire; and
   d) an external plate having a top surface and being attached to said upper surface of said lower electrode plate over said electrode band of wound wire, and said top surface of said external plate is exposed for attachment to an external electrical connector.

12. The electrode structure of claim 11, wherein at least one winding of said wound wire of said electrode band is welded to said lower electrode plate.

13. The electrode structure of claim 12, wherein said external plate is attached to said at least one lower electrode plate.

14. The electrode structure of claim 13, wherein said external plate bridges said recess over said electrode band.

15. The electrode structure of claim 14, wherein said at least one lower electrode plate has a double ramp cross-section.

16. The electrode structure of claim 11, wherein said second layer is a ceramic layer.

17. The electrode structure of claim 11, wherein said second layer is a metallic layer.

\* \* \* \* \*